(12) United States Patent
Hsueh et al.

(10) Patent No.: US 6,489,213 B1
(45) Date of Patent: Dec. 3, 2002

(54) METHOD FOR MANUFACTURING SEMICONDUCTOR DEVICE CONTAINING A SILICON-RICH LAYER

(75) Inventors: Cheng-Chen Calvin Hsueh, Sunnyvale, CA (US); Shih-Ked Lee, Fremont, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 08/583,386

(22) Filed: Jan. 5, 1996

(51) Int. Cl.$^7$ ............................................. H01L 21/20
(52) U.S. Cl. ....................................... 438/382; 438/384
(58) Field of Search ................................. 437/235, 238, 437/240, 60, 52, 233, 918, 978; 438/382, 384

(56) References Cited

U.S. PATENT DOCUMENTS

| | | | |
|---|---|---|---|
| 4,702,937 A | * 10/1987 | Yamoto et al. | 437/233 |
| 4,807,016 A | * 2/1989 | Douglas | 437/240 |
| 4,907,053 A | * 3/1990 | Ohmi | 357/23.1 |
| 4,935,380 A | * 6/1990 | Okumura | 437/44 |
| 4,952,524 A | 8/1990 | Lee et al. | 437/67 |
| 4,961,103 A | * 10/1990 | Saitoh et al. | 357/59 |
| 5,021,843 A | * 6/1991 | Ohmi | 357/23.1 |
| 5,057,897 A | 10/1991 | Nariani et al. | |
| 5,060,047 A | * 10/1991 | Jaume et al. | 357/3 |
| 5,200,358 A | 4/1993 | Bollinger et al. | 437/180 |
| 5,212,119 A | * 5/1993 | Hah et al. | 437/235 |
| 5,231,058 A | 7/1993 | Maeda et al. | 437/235 |
| 5,252,515 A | * 10/1993 | Tsai et al. | 437/195 |
| 5,286,681 A | 2/1994 | Maeda et al. | 437/240 |
| 5,290,727 A | 3/1994 | Jain et al. | 437/52 |
| 5,300,463 A | * 4/1994 | Cathey et al. | 437/40 |
| 5,312,781 A | 5/1994 | Gregor et al. | 437/235 |
| 5,328,872 A | 7/1994 | Manocha et al. | 437/235 |
| 5,336,640 A | * 8/1994 | Sato | 437/240 |
| 5,387,546 A | 2/1995 | Maeda et al. | 437/174 |
| 5,399,389 A | 3/1995 | Hieber et al. | 427/579 |
| 5,399,532 A | 3/1995 | Lee et al. | 437/228 |
| 5,429,974 A | 7/1995 | Hsue et al. | 437/52 |
| 5,429,975 A | 7/1995 | Sheu et al. | 437/52 |
| 5,470,779 A | * 11/1995 | Yoo | 437/52 |
| 5,498,559 A | * 3/1996 | Chang | 437/43 |
| 5,578,523 A | 11/1996 | Fiordalice et al. | |

OTHER PUBLICATIONS

Wolf, Stanley "Silicon Processing for the VLSI Era", vol. 2, pp. 194–196 (1990).*
El–Kareh, Badih "Fundamentals of Semiconductor Processing Technology", pp. 117–120 (1995).*

* cited by examiner

*Primary Examiner*—Olik Chaudhuri
*Assistant Examiner*—Erik Kielin
(74) *Attorney, Agent, or Firm*—Christopher Novak

(57) ABSTRACT

A semiconductor device having a controlled resistance value within a predetermined range. The semiconductor device includes a substrate and an oxide layer provided above the substrate. There is also included a first dielectric layer that is silicon-rich above the oxide layer. There is further included a second dielectric layer above the silicon-rich layer.

26 Claims, 5 Drawing Sheets

METHOD FOR MANUFACTURING SEMICONDUCTOR DEVICE CONTAINING A SILICON-RICH LAYER

FIELD OF THE INVENTION

The present invention relates to semiconductor devices and methods for their manufacture. More particularly, the present invention relates to semiconductor devices having a structure and method that results in better control over the resistance properties.

BACKGROUND OF THE INVENTION

The use of doped silicate glass as an interlayer insulator dielectric is known. When so used, the doped silicate glass layer physically and electrically isolates adjacent layers of the IC wafer. For example, in a typical IC, this interlayer dielectric may be pre-metal or between polysilicon layers.

In the prior art, borophosphosilicate glass (BPSG), which is typically formed via a conventional chemical vapor deposition (CVD) process, and plasma-enhanced borophosphosilicate glass (PEBPSG), which is formed using a plasma-enhanced CVD process, have been widely used as the doped silicate glass insulator material. One of the salient features of PEBPSG/BPSG is its ability to flow and planarize at elevated temperatures (e.g., above 900° C.).

As device geometries become smaller and thermal budgets (i.e., the amount of heat the IC can be exposed to) for the fabrication of a particular IC device become more stringent, however, the high temperature requirement of PEBPSG/BPSG proves to be a liability. This is because the PEBPSG/BPSG material does not achieve adequate gap-fill, i.e., the filling of gaps and trenches in the wafer surface, and acceptable planarization characteristics at lower annealing temperatures and/or for submicron geometries.

There is also a prior art ozone-TEOS (tetraethylorthosilicate) process, which produces BPSG with the capability of flowing at lower temperatures (referred to herein as borophospho-tetraethylorthosilicate TEOS glass or BPTEOS). This ozone-TEOS process will be described in greater detail later herein. Because of the lower annealing temperature of BPTEOS, this process is particularly desirable for modern high density, low thermal budget devices. BPTEOS films have, however, certain disadvantages that potentially render them unsuitable for use with certain classes of IC devices.

It has been found that the use of BPTEOS insulating film renders the gate oxide regions of certain MOS devices, such as static random access memory (SRAM) devices, vulnerable to hot carrier degradation. This hot carrier degradation problem is discussed in detail in the existing literature, particularly in U.S. Pat. No. 5,290,727.

It is also known that when BPTEOS is used as an interlayer insulator material, its relative porosity exposes underlying regions to contamination from environmental contaminants such as chemicals or various gases (e.g., hydrogen) used in the back-end processes. The diffusion of contaminants into the underlying regions potentially affects the electrical behaviors of these affected underlying regions. This contamination problem is particularly detrimental to underlying polysilicon load resistor regions, i.e., underlying regions of the polysilicon layer that act as resistors. When contaminated, the resistance values of the polysilicon load resistors may increase or decrease, or even fluctuate beyond their specified values, possibly to the point of causing the affected device to generate erroneous results or even rendering the device completely inoperable.

In view of the foregoing, what is desired is a method and apparatus for protecting the resistance value of polysilicon load resistors from contamination-induced variations in IC devices.

SUMMARY OF THE INVENTION

The invention relates, in one embodiment, to a method of manufacturing a semiconductor device, which includes the steps of providing a substrate and forming an oxide layer above the substrate. Further, there are included the steps of forming as a first dielectric layer a silicon-rich layer above the oxide layer, and forming a second dielectric layer above the silicon-rich dielectric layer. In one embodiment, the oxide layer is formed of TEOS.

In yet another embodiment, the invention relates to a semiconductor device having a controlled resistance value within a predetermined range. The semiconductor device includes a substrate and an oxide layer provided above the substrate. There is also included a first dielectric layer that is silicon-rich above the oxide layer. There is further included a second dielectric layer above the silicon-rich layer. Together, the oxide layer and the silicon-rich first dielectric layer form a barrier to substantially protect the underlying substrate from contamination.

BRIEF DESCRIPTION OF THE DRAWINGS

Additional advantages of the invention will become apparent upon reading the following detailed description and upon reference to the drawings.

DETAILED DESCRIPTION OF THE INVENTION

FIGS. 1A–E show the processing steps involved in forming a TEOS-buffered silicon-rich oxide (TB-SRO) barrier structure of the present invention, which comprises a layer of silicon-rich, i.e., oxygen deficient, oxide disposed above a TEOS oxide layer. When disposed above polysilicon load resistors, the TEOS-buffered silicon-rich oxide barrier structure advantageously results in an IC that has more stable load resistors. This is accomplished by reducing the susceptibility of the underlying load resistors to contamination.

Figure 1A:
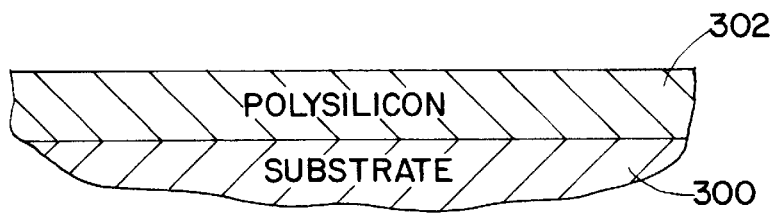
FIGS. 1A–1E show, for illustration purposes, the processing steps involved in forming a TEOS-buffered silicon-rich oxide (TB-SRO) barrier structure.

In FIG. 1A, a substrate 300 is provided. Substrate 300 represents, for example, a semiconductor wafer (e.g., a silicon wafer) and its associated active devices. Substrate 300 preferably represents a semiconductor substrate in which an SRAM device or other devices that utilize a polysilicon load resistor is to be constructed, preferably substrate 300 has the transistors already formed thereon.

Above substrate 300, there is formed a polysilicon layer 302, representing the poly-2 layer for constructing the load resistors (in its undoped or lightly doped regions) and certain interconnect structures (in its more heavily doped region). Polysilicon layer 302 is preferably deposited by the thermal decomposition of silane ($SiH_4$) using a low pressure CVD (LPCVD) process, although other known techniques may well be employed.

Figure 1B:
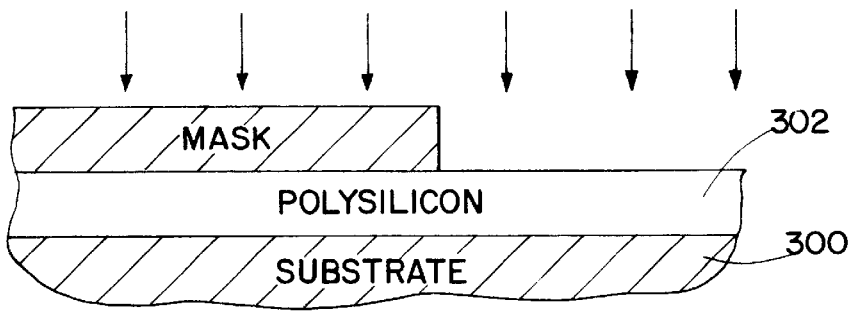

In FIG. 1B, polysilicon layer 302 is patterned, using a conventional photoresist technique, that masks the polysilicon layer to provide for selective implantation of dopants, thereby forming conductive regions, i.e., the aforementioned interconnect poly-2 structures, out of the substantially resistive undoped poly-2 layer. By way of example, one such photoresist technique involves the application of a resist material, the exposure of the resist in a contact or stepper lithography system, and the development of the resist to form a mask. This mask is shown in FIG. 1B as mask 304.

The areas of polysilicon layer 302 that are left unprotected by mask 304 represent the areas where the implantation of dopants occurs. In the example of FIG. 1, arsenic is used as the dopant, although it should be noted that other types of dopants may well be employed.

Figure 1C:
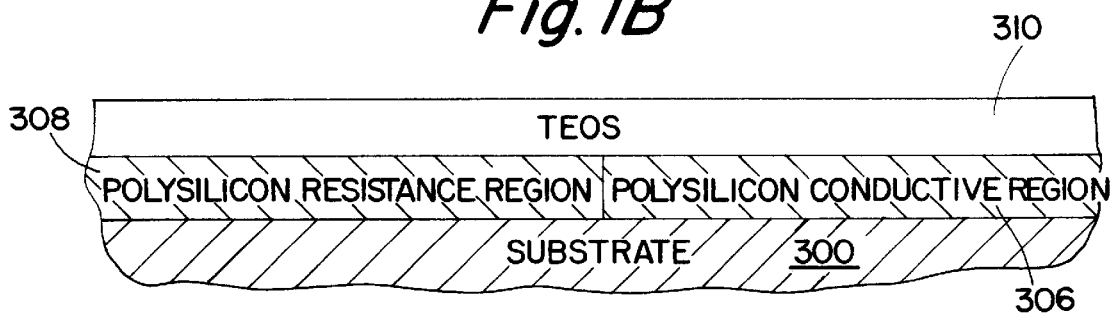

In FIG. 1C, the aforementioned implantation process is completed. Mask 304 of FIG. 1B is removed. The polysilicon layer 302 in FIG. 1B now comprises two regions shown in FIG. 1C: a polysilicon resistive region 306 and a polysilicon conductive region 308. In the preferred embodiment, polysilicon resistive region 306 is preferably undoped and has an intrinsic resistance in the range of giga-ohms. In an alternative embodiment, however, polysilicon resistive region 306 may be doped as appropriate to achieve the desired resistance value. Polysilicon conductive region 308, on the other hand, is preferably heavily doped to render it substantially conductive.

A layer of TEOS (tetraethylorthosilicate) oxide ($SiO_2$) is then formed on top of polysilicon layer 302. In one embodiment, TEOS oxide layer 310 is formed in a PECVD process in which TEOS reacts with oxygen in a plasma environment. One suitable process for the formation of TEOS oxide layer 310 involves the Novellus Concept I PECVD system by Novellus Systems, Inc. at about 350° C. and about 2 Torr. It is this TEOS oxide layer, in cooperation with the subsequently formed silicon-rich oxide ($SiO_2$) layer, that advantageously protects the resistance value of the underlying poly-2 resistive region 306 from contamination-induced variations.

Figure 1D:
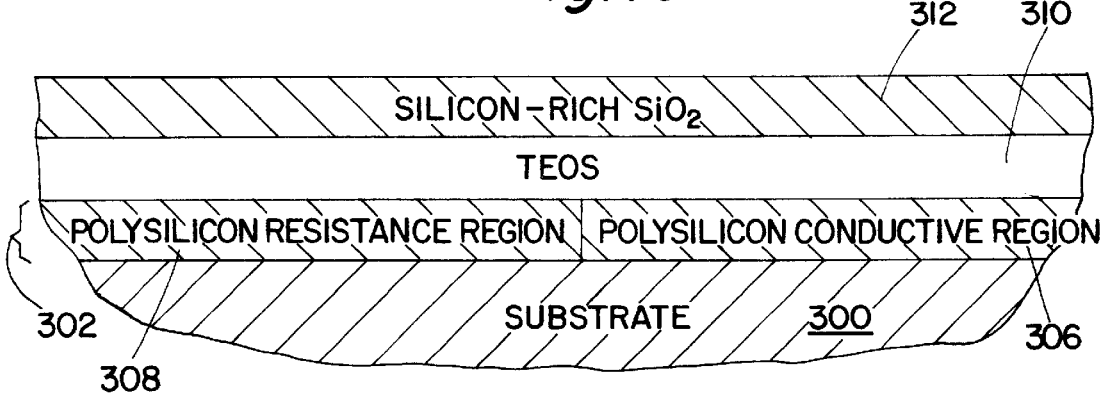

In FIG. 1D, a silicon-rich oxide layer 312 is formed above TEOS oxide layer 310. A suitable silicon-rich oxide layer 312 may be formed by the plasma-enhanced reaction between $SiH_4$ and $N_2O$ or $O_2$ at temperatures between about 200 to about 450° C. in a PECVD reactor such as the aforementioned Novellus PECVD system. In accordance with the present invention, silicon-rich layer 312 is enriched with silicon to produce a composition of $SiO_x$, X being less than two. The stoichiometry of the silica film nay be controlled by, for example, adjusting the ratio of $SiH_4$ to $N_2O$.

Depending on the geometries, the desired protection level for the underlying polysilicon layer 302, and the fabrication process, the TEOS oxide layer 310 and silicon-rich oxide layer 312 may be dimensioned as desired. In one embodiment, each of TEOS oxide layer 310 and silicon-rich oxide layer 312 is about 500 to about 3000 angstroms thick, preferably about 1000 angstroms thick. The refractive index for TEOS oxide layer 310 is about 1.45 to about 1.46, while the refractive index for silicon-rich oxide layer 312 is about 1.47 to about 1.52, preferably from about 1.47 to about 1.50.

Figure 1E:
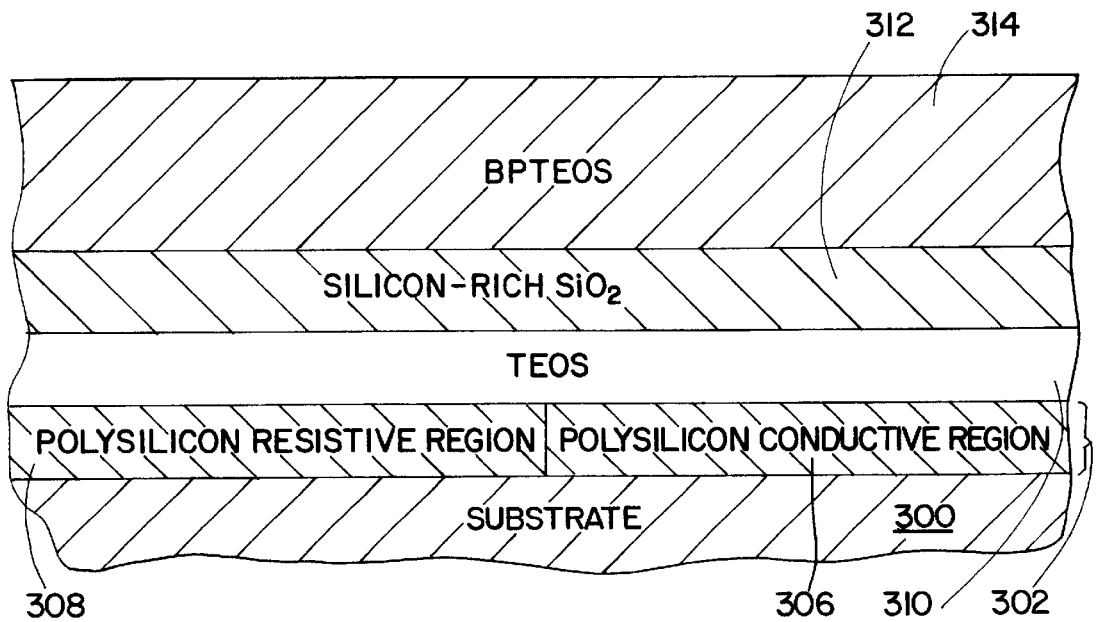

In FIG. 1E, a layer of BPTEOS 314 is formed above silicon-rich $SiO_2$ layer 312. The combination of silicon-rich $SiO_2$ layer 312 and TEOS oxide layer 310 advantageously protects against contamination of the underlying poly-2 resistors, thereby making it possible to use the lower anneal temperature, albeit more porous, BPTEOS material as the interlayer insulating dielectric. In fact, because of the protective quality of the above combination, the porosity of the doped silicate glass insulator layer, e.g., the BPTEOS layer, is not an issue as far as contamination of the underlying polysilicon resistors is concerned.

BPTEOS layer 314 can be formed from a variety of precursors such as TEOS (tetraethylorthosilicate), TMB (trimethylborate), TMP (trimethylphosphite). In one embodiment, BPTEOS layer 314 is formed by reacting precursors in a CVD reactor at atmospheric pressure (APCVD) or sub-atmospheric pressure (SACVD), both with the addition of oxygen and ozone ($O_3$). In this case, the process is called ozone-BPTEOS or $O_3$-BPTEOS. Suitable systems for the APCVD and SACVD formation of BPTEOS include respectively the WJ TEOS-999 system from Watkins-Johnson Co. and the Precision 5000 system from Applied Materials, Inc. BPTEOS films can also be produced by plasma-enhanced CVD (PECVD) processes, which have the advantage of lower deposition temperatures, using, for example, the Applied Materials system.

BPTEOS layer 314 is typically deposited to a thickness of about 2,000 to about 20,000 angstroms, and preferably from about 6,000 to about 15,000 angstroms thick, and more preferably at about 6,500 angstroms thick, although other thickness ranges may suffice for some devices. In one embodiment, the preferred dopant concentration is about 0 to about 6.0 wt % boron and about 4.0 to about 8.0 wt % phosphorous. More preferably, the dopant concentration is from about 2.0 to about 3.5 wt % boron and about 5.0 to about 6.5 wt % phosphorous. Even more preferably, the dopant concentration is about 2.8 to about 3.3 wt % boron and about 5.8 to about 6.3 wt % phosphorous.

Figure 1F:
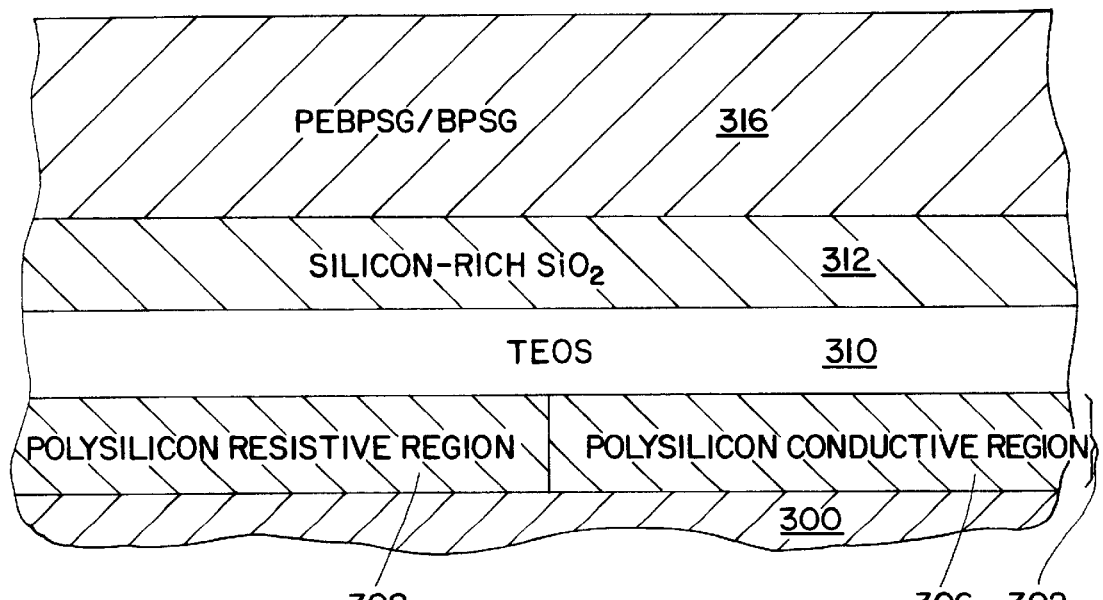

The combination of silicon-rich oxide layer 312 and TEOS oxide layer 310 also proves to be advantageous in improving protection of underlying poly-2 layer 302 against contamination from back-end processes even when PEBPSG/BPSG is employed as the interlayer insulating dielectric material. As mentioned earlier, when the TEOS-buffered silicon-rich oxide barrier is employed, the porosity of the doped silicate glass insulator layer, e.g., the PEBPSG/BPSG layer, is not an issue as far as contamination of the underlying polysilicon resistors is concerned. If desired, the PEBPSG/BPSG layer may now be made thinner without compromising protection of the underlying polysilicon resistors. FIG. 1F shows an alternative embodiment in which a PEBPSG/BPSG layer 316 is formed above silicon-rich oxide layer 312 and TEOS oxide layer 310.

Figure 2:
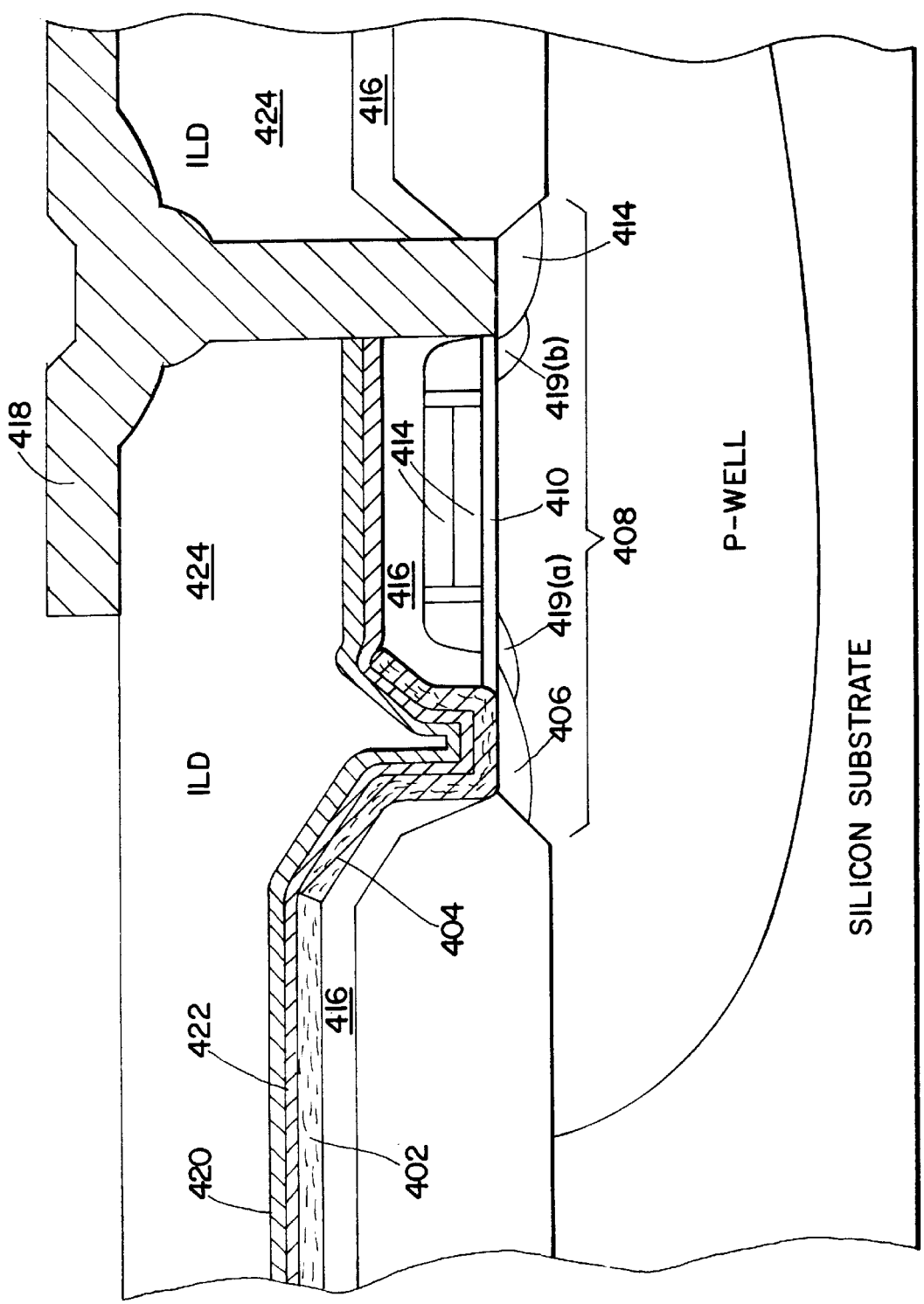
FIG. 2 illustrates, in one embodiment of the present invention, the relevant portion of an SRAM structure, showing a poly-2 load resistor.

FIG. 2 illustrates, in one embodiment of the present invention, a relevant portion of an SRAM structure, including a poly-2 load resistor comprising poly-2 load resistor region 402 and substantially conductive poly-2 interconnect region 404. In the preferred embodiment, poly-2 load resistor region 402 is preferably undoped but it may also be lightly doped, e.g., via ion implantation or other well-known doping process, to achieve a desired resistance level in some embodiment.

The poly-2 load resistor is coupled to a drain 406 of a device 408. Other structures of device 408, such as poly-1 gate oxide region 410, source 414, gate structures 412, and metal interconnect 418 are conventional in construction. Also shown are optional lightly-doped drain structures 419 (*a*) and 419(*b*) for improving hot carrier lifetimes, the use of which is familiar to those skilled in the art.

As shown in FIG. 2, the poly-2 layer, which comprises poly-2 load resistor region 402 and poly-2 interconnect region 404, is physically isolated from selective structures of device 408 by an interpoly dielectric layer 416. Above the poly-2 layer, there is disposed a barrier comprising a silicon-rich oxide layer 420 on top of TEOS oxide layer 422.

In the example of FIG. 2, the TEOS-buffered silicon-rich oxide barrier is optionally permitted to overlay the gate structure of device 408. When so disposed, the barrier further functions to reduce the hot carrier degradation affecting device 408. In this manner, the TEOS-buffered silicon-rich $SiO_2$ barrier serves to both stabilize the conductivity of the poly-2 layer and improve the device's hot carrier lifetime.

Interlayer dielectric (ILD) layer 424 insulates the structures of FIG. 2 from subsequently formed metallization layers, such as metal layer 418. As is known, multiple ILD layers may be required if the device involves multiple metallization steps.

Figure 3:
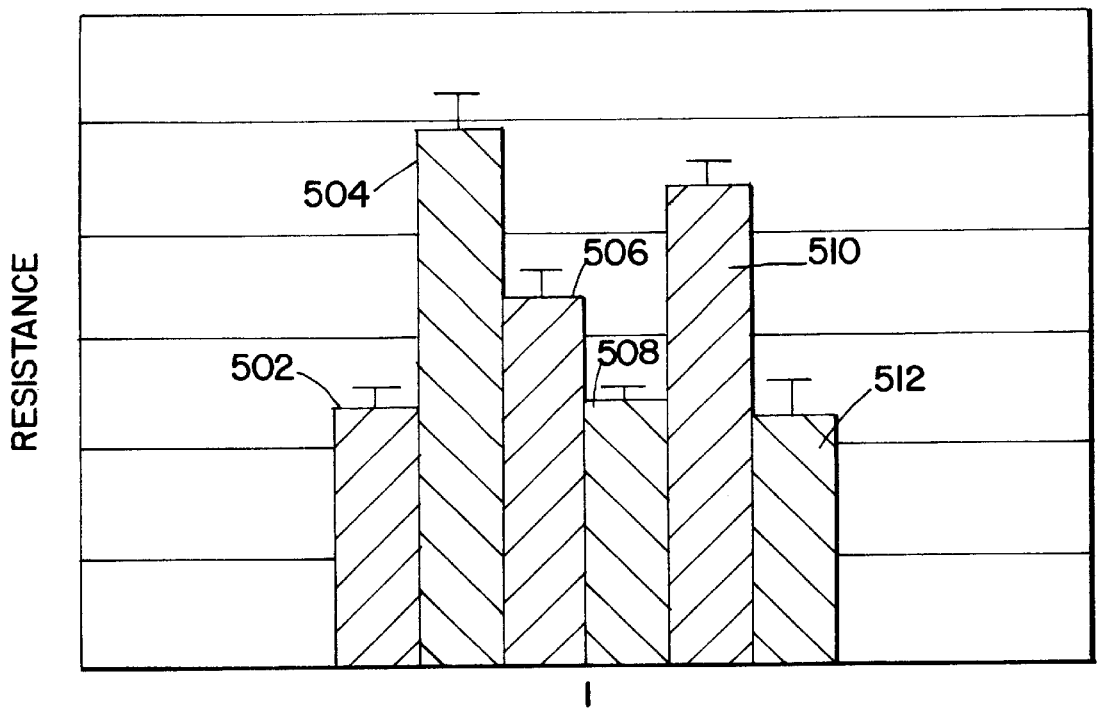
FIG. 3 is a bar graph illustrating, in one example, the effectiveness of the TEOS-buffered silicon-rich oxide barrier in stabilizing the conductivity of the poly-2 load resistors.

FIG. 3 is a bar graph illustrating the effectiveness of the TEOS-buffered silicon-rich oxide barrier, such as that comprising layers 310 and 312 of FIGS. 1D–F, in stabilizing the conductivity of the poly-2 resistors. Bar 502 represents the resistance of the control structure, which comprises a polysilicon resistor disposed under a first barrier structure comprising a TEOS oxide layer. The interlayer dielectric material associated with bar 502 is PEBPSG.

Bar 504 represents the resistance of the same polysilicon resistor when protected by a barrier structure comprising TEOS oxide and an interlayer dielectric material that is 3 weight-percent (wt %) boron and 6 wt % phosphorous BPTEOS. The barrier structure associated with bar 504 provides little protection for the polysilicon resistor from contamination, as evidenced by an increase of over 100% in the resistance value over control bar 502.

Bar 506 represents the resistance of the same polysilicon resistor when protected by yet another barrier structure comprising a layer of stoichiometric (not silicon-rich) oxide ($SiO_2$) disposed on top of a TEOS oxide layer. Like bar 504, the interlayer dielectric material associated with bar 506 is a 3 wt % boron and 6 wt % phosphorous BPTEOS layer. Although some resistance stabilizing effect is shown, i.e., the resistance value of bar 506 is closer to control bar 502 when compared to the resistance value of bar 504, the underlying polysilicon resistor is not, however, as closely matched to the resistance of the control as in the case with a TEOS buffered silicon-rich sample.

Bar 508 represents the resistance of the same polysilicon resistor when protected by a TEOS-buffered silicon-rich oxide barrier. The TEOS-buffered silicon-rich oxide barrier associated with bar 508 comprises a silicon-rich oxide layer disposed over a TEOS oxide layer. Like bar 504 and 506, the interlayer dielectric material associated with bar 508 is a 3 wt % boron and 6 wt % phosphorous BPTEOS layer. As shown in FIG. 3, this barrier proves effective in stabilizing the resistance of the polysilicon resistor by maintaining substantially the same resistance as that shown by control bar 502.

Bar 510 represents the resistance of the same polysilicon resistor when protected by yet another barrier structure comprising a layer of stoichiometric (not silicon-rich) oxide layer atop a TEOS oxide layer. The interlayer dielectric material associated with bar 510 is a 4 wt % boron and 4 wt % phosphorous BPTEOS layer. The change affecting the polysilicon resistor value is evidenced by the increase in the size of bar 510 relative to control bar 502, which suggests the general ineffectiveness of this barrier.

Bar 512 represents the resistance of the same polysilicon resistor when protected by a TEOS-buffered silicon-rich oxide barrier. The TEOS-buffered silicon-rich oxide barrier associated with bar 508 comprises a silicon-rich oxide layer disposed over a TEOS oxide layer. Like bar 510, the interlayer dielectric material associated with bar 512 is a 4 wt % boron and 4 wt % phosphorous BPTEOS layer. This time, however, the resistance value of the polysilicon resistor is shown to be substantially equal to the value of control bar 502. As is apparent from FIG. 3, the presence of the silicon-rich oxide layer, in combination with its underlying TEOS oxide layer, proves surprisingly effective in stabilizing the resistance value of underlying polysilicon resistors.

Figure 4:
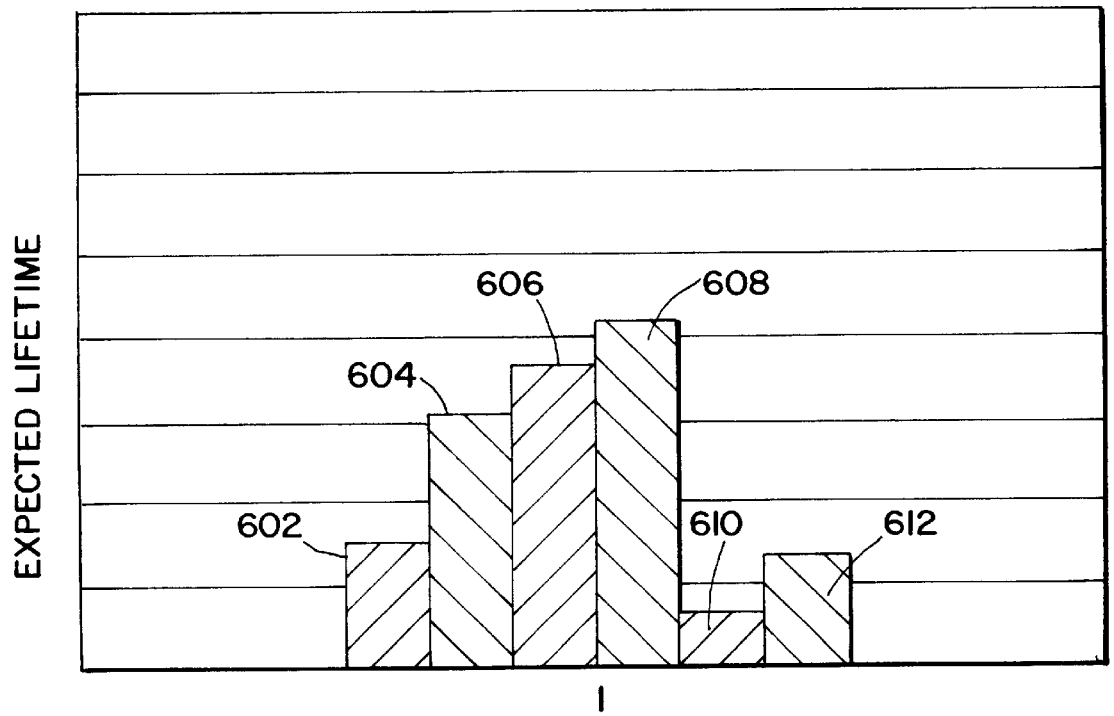
FIG. 4 is a bar graph illustrating the effect of the TEOS-buffered silicon-rich oxide barrier in reducing hot carrier degradation.

FIG. 4 illustrates the effect of the TEOS-buffered silicon-rich oxide barrier in reducing hot carrier degradation. In FIG. 4, 10% degradation of drain current is used as a threshold to estimate the lifetime of the device. The bars shown in FIG. 4 contain the same barrier composition as the bars of similar color and pattern in FIG. 3.

Note that the presence of the silicon-rich $SiO_2$ layer in bars 608 and 612 increases the estimated hot carrier lifetime of the device over respective bars 610 and 606, in which stoichiometric (not silicon-rich) oxide layers are employed. Interestingly, the expected lifetime of the device appears to improve more when a 3 wt % boron and 6 wt % phosphorous BPTEOS film is used (bars 606 and 608) instead of a 4 wt % boron and 4 wt % phosphorous BPTEOS film (bars 610 and 612). In other words, the expected hot carrier lifetime of the device varies depending on the composition of the BPTEOS interlayer insulating film.

Figure 5:
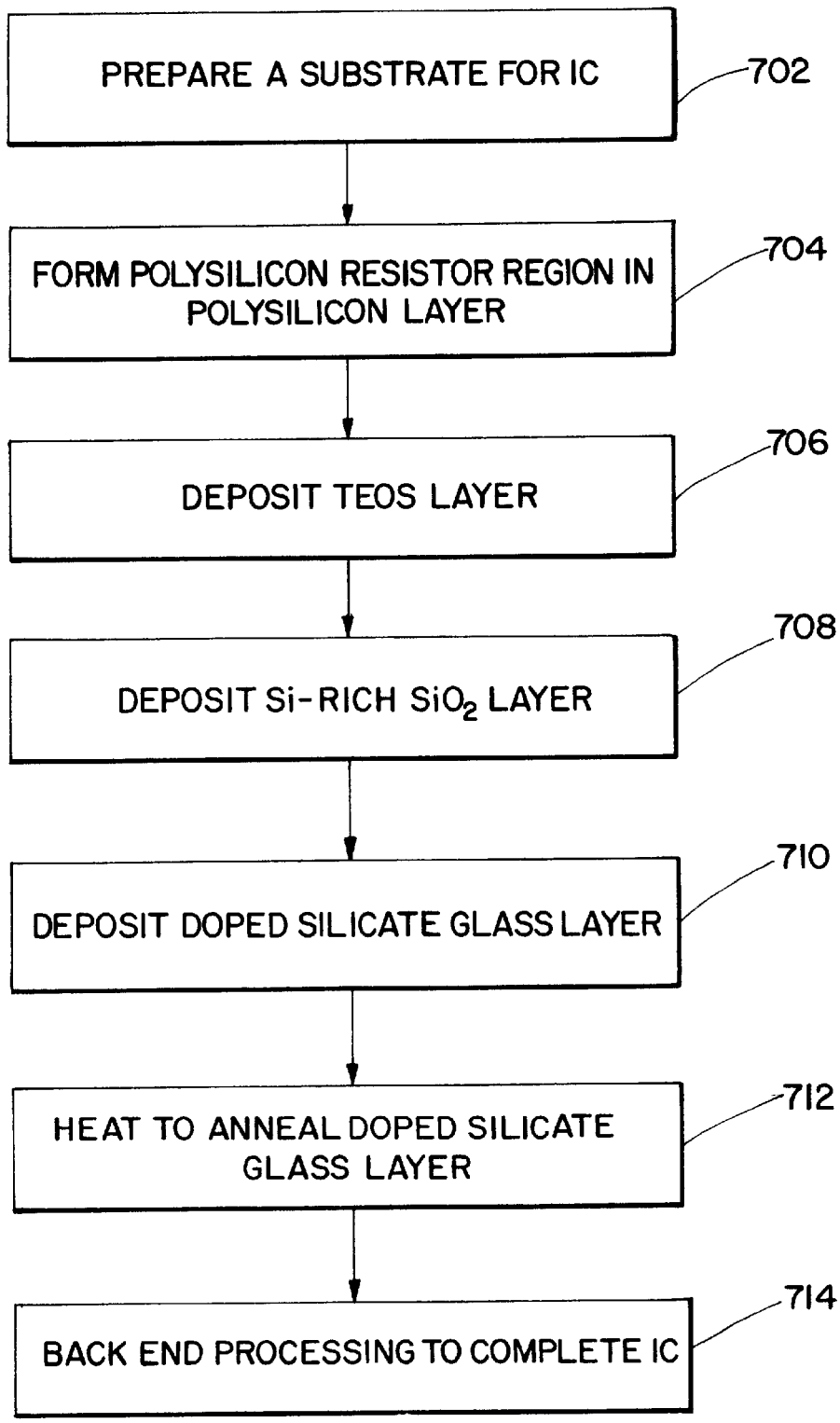
FIG. 5 illustrates the steps involved in fabricating an integrated circuit device (IC) in one embodiment of the invention.

FIG. 5 illustrates, in one embodiment, the steps involved in fabricating an integrated circuit device (IC) that employs the disclosed TEOS-buffered silicon-rich oxide barrier to protect its polysilicon load resistors from contamination-induced variations. In one embodiment, the IC formed by the steps of FIG. 5 preferably represents an SRAM chip, or any IC device that employs polysilicon load resistors.

In step 702, a substrate for an IC device is prepared. The substrate in step 702 preferably includes the semiconductor wafer and more preferably includes the active devices as well as the aforementioned poly-2 layer.

In step 704, a polysilicon resistor region is formed in a polysilicon layer disposed above the substrate. The polysilicon resistor region may be formed by, for example, the steps described in FIGS. 1A–1F. This step is well known to those skilled in the art. In step 706, a layer of TEOS oxide is deposited on top of the polysilicon resistor region formed in step 704. The TEOS oxide layer acts as an anti-diffusion barrier to prevent undesirable chemical interactions between the polysilicon resistor region formed in step 704 and the subsequently deposited silicon-rich oxide layer of step 708. Further, this TEOS oxide layer acts, in cooperation with a subsequently deposited silicon-rich $SiO_2$ layer, to substantially reduce the contamination of the polysilicon layer when the wafer is exposed to potential contaminants. Exemplary parameters for the formation of the layer of step 706 were presented previously.

In step 708, a layer of silicon-rich oxide is deposited above the TEOS oxide layer to form a barrier. Again, exemplary parameters for the formation of the layer of step

708 were presented previously. In step 710, the doped silicate glass layer that acts as the interlayer insulator material or the insulating planarization layer is deposited above the silicon-rich oxide layer of step 708. Exemplary parameters for the formation of the layer of step 710 were also presented previously. In the preferred embodiment, BPTEOS with its advantageously low annealing temperatures is the doped silicate glass material. However, it is contemplated that other doped silicate glass materials such as PEBPSG or BPSG may be employed.

In step 712, the layer of doped silicate glass deposited in step 710 is heated in a conventional manner to reflow the insulating material. In step 714, known back-end processing steps are performed to complete the IC. As is known to those skilled in the art, the back-end processing steps of step 714 vary from device to device and from process to process. They may include, for example, the formation of the metallization layer(s) and the passivation step, among others.

While this invention has been described in terms of several preferred embodiments, it is understood that various alterations, substitutions, and equivalents fall within the scope of this invention. It should also be noted that many alternative ways of implementing the methods and apparatuses of the present invention exist. It is therefore intended that the following appended claims be interpreted as including all such alterations, substitutions, and equivalents that fall within the spirit and scope of the present invention.

What is claimed is:

1. A method of manufacturing a semiconductor device comprising:
   a) providing a substrate;
   b) forming an oxide layer above said substrate;
   c) providing a layer containing a polycrystalline semiconductor between said substrate and said oxide layer, wherein said polycrystalline semiconductor comprises a resistor;
   d) forming as a first dielectric layer a silicon-rich layer above said oxide layer and completely contiguous with a surface of said oxide layer, said silicon-rich layer having an upper surface and a lower surface; and
   e) forming a second dielectric layer above said silicon-rich layer.

2. The method of claim 1, wherein said silicon-rich layer comprises a SiOx layer, where x<2.

3. The method of claim 1, wherein said silicon-rich layer has a thickness of about 500 Å to about 3000 Å.

4. The method of claim 1, wherein said second dielectric layer is doped silicate glass.

5. The method of claim 4, wherein said doped silicate glass layer comprises BPTEOS.

6. The method of claim 5, wherein said second dielectric layer is doped with boron between about 2.0 weight percent and about 3.5 weight percent and a concentration of phosphorous between about 5.0 weight percent and about 6.5 weight percent.

7. The method of claim 1 wherein said silicon-rich dielectric layer has a refractive index between the range of about 1.47 to about 1.52.

8. The method of claim 1, wherein said oxide layer comprises TEOS.

9. The method of claim 1, wherein said second dielectric layer is doped with boron between about 2.0 weight percent and about 3.5 weight percent and a concentration of phosphorous between about 5.0 weight percent and about 6.5 weight percent.

10. A method of manufacturing a semiconductor device comprising:
    a) providing a substrate;
    b) providing a layer containing a polycrystalline semiconductor above said substrate, wherein said polycrystalline semiconductor comprises a resistor;
    c) forming a silicon-rich layer;
    d) forming an oxide layer between said resistor and said silicon-rich layer; wherein said silicon-rich layer is contiguous with a surface of said oxide layer; and
    e) forming a dielectric layer above said silicon-rich layer.

11. The method of claim 10, wherein said silicon-rich layer comprises a SiOx layer, where x<2.

12. The method of claim 10, wherein said silicon-rich layer has a thickness of about 500 Å to about 3000 Å.

13. The method of claim 10, wherein said dielectric layer is doped silicate glass.

14. The method of claim 13, wherein said doped silicate glass layer comprises BPTEOS.

15. The method of claim 10, wherein said oxide layer comprises TEOS.

16. The method of claim 10, wherein said dielectric layer is doped with boron between about 2.0 weight percent and about 3.5 weight percent and a concentration of phosphorous between about 5.0 weight percent and about 6.5 weight percent.

17. The method of claim 13, wherein said dielectric layer is doped with boron between about 2.0 weight percent and about 3.5 weight percent and a concentration of phosphorous between about 5.0 weight percent and about 6.5 weight percent.

18. The method of claim 10, wherein said silicon-rich layer has a refractive index between the range of about 1.47 to about 1.52.

19. A method of manufacturing a semiconductor device comprising:
    a) providing a substrate;
    b) providing a layer containing a polycrystalline semiconductor above said substrate, wherein said polycrystalline semiconductor comprises a resistor;
    c) forming a silicon-rich layer;
    d) forming a TEOS layer between said resistor and said silicon-rich layer,
    wherein said silicon-rich layer is contiguous with a surface of said oxide layer; and
    forming a dielectric layer above said silicon-rich layer.

20. The method of claim 19, wherein said silicon-rich layer comprises a SiOx layer, where x<2.

21. The method of claim 19, wherein said silicon-rich layer has a thickness of about 500 Å to about 3000 Å.

22. The method of claim 19, wherein said dielectric layer is doped silicate glass.

23. The method of claim 22, wherein said doped silicate glass layer comprises BPTEOS.

24. The method of claim 19, wherein said dielectric layer is doped with boron between about 2.0 weight percent and about 3.5 weight percent and a concentration of phosphorous between about 5.0 weight percent and about 6.5 weight percent.

25. The method of claim 23, wherein said dielectric layer is doped with boron between about 2.0 weight percent and about 3.5 weight percent and a concentration of phosphorous between about 5.0 weight percent and about 6.5 weight percent.

26. The method of claim 19, wherein said silicon-rich layer has a refractive index between the range of about 1.47 to about 1.52.

* * * * *